(12) United States Patent
Lim et al.

(10) Patent No.: US 9,032,795 B2
(45) Date of Patent: May 19, 2015

(54) MEMS RESONATOR, SENSOR HAVING THE SAME AND MANUFACTURING METHOD FOR MEMS RESONATOR

(75) Inventors: Geunbae Lim, Gyeongsangbuk-Do (KR); Taechang An, Gyeongsangbuk-Do (KR); Jinyoung Kim, Gyeongsangbuk-Do (KR); Jungwoo Sung, Gyeongsangbuk-Do (KR); Sangwoo Lee, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 289 days.

(21) Appl. No.: 13/519,451

(22) PCT Filed: May 4, 2011

(86) PCT No.: PCT/KR2011/003333
§ 371 (c)(1),
(2), (4) Date: Jun. 27, 2012

(87) PCT Pub. No.: WO2012/138006
PCT Pub. Date: Oct. 11, 2012

(65) Prior Publication Data
US 2012/0279302 A1    Nov. 8, 2012

(51) Int. Cl.
| G01C 19/56 | (2012.01) |
| G01P 15/125 | (2006.01) |
| H03H 3/007 | (2006.01) |
| G01C 19/5783 | (2012.01) |
| H03H 9/02 | (2006.01) |
| H03H 9/24 | (2006.01) |
| B81C 1/00 | (2006.01) |

(52) U.S. Cl.
CPC ......... *H03H 3/0072* (2013.01); *G01C 19/5783* (2013.01); *H03H 9/02338* (2013.01); *H03H 9/2457* (2013.01); *B81C 1/00682* (2013.01); *B81B 2201/0271* (2013.01)

(58) Field of Classification Search
USPC ............... 73/504.12, 504.14, 504.16, 504.02, 73/504.04, 504.15, 514.32, 514.31, 514.34
See application file for complete search history.

(56) References Cited

U.S. PATENT DOCUMENTS

| 3,940,636 A * | 2/1976 | Perahia ..................... 310/313 B |
| 4,715,227 A * | 12/1987 | Pittman ..................... 73/504.03 |
| 7,886,596 B2 * | 2/2011 | Matsunaga et al. ........ 73/504.02 |
| 8,362,618 B2 * | 1/2013 | Busnaina et al. ............. 257/773 |

(Continued)

FOREIGN PATENT DOCUMENTS

| JP | 2007-058105 A | 3/2007 |
| KR | 2003-0008057 A | 1/2003 |
| KR | 2010-0096665 A | 9/2010 |

*Primary Examiner* — Helen Kwok
(74) *Attorney, Agent, or Firm* — Scully, Scott, Murphy & Presser, P.C.

(57) ABSTRACT

A microelectromechanical system (MEMS) resonator, a sensor having the same and a method for manufacturing the MEMS resonator are provided. The MEMS resonator includes a base substrate of the MEMS resonator, the base substrate having a recess portion recessed into one surface thereof, an oscillator mounted at the base substrate and at least partially overlapping the recess portion to be vibrated using an empty space of the recess portion, and a wire connected to the oscillator and the base substrate, respectively, to control a natural frequency of the MEMS resonator by supporting at least part of the oscillator. Accordingly, the natural frequency of the resonator can be easily controlled.

9 Claims, 8 Drawing Sheets

(56) References Cited

U.S. PATENT DOCUMENTS

| | | | |
|---|---|---|---|
| 8,647,490 B2* | 2/2014 | Choi et al. | 205/76 |
| 2004/0011650 A1* | 1/2004 | Zenhausern et al. | 204/547 |
| 2005/0126913 A1* | 6/2005 | Burke et al. | 204/547 |
| 2006/0053883 A1* | 3/2006 | Hayashi et al. | 73/504.12 |
| 2006/0162453 A1* | 7/2006 | Mikado et al. | 73/514.29 |
| 2006/0219008 A1* | 10/2006 | Tanaka et al. | 73/504.16 |
| 2008/0165403 A1 | 7/2008 | Grasshoff et al. | |
| 2009/0250689 A1* | 10/2009 | Colli | 257/39 |
| 2012/0061241 A1* | 3/2012 | Lentaris et al. | 204/477 |
| 2012/0085649 A1* | 4/2012 | Sano et al. | 204/547 |

* cited by examiner (a)

(b)

(c)

(d)

(e)

(f)

(g)

(h)

MEMS RESONATOR, SENSOR HAVING THE SAME AND MANUFACTURING METHOD FOR MEMS RESONATOR

TECHNICAL FIELD

The present invention relates to a method for manufacturing a microelectromechanical system (MEMS) resonator, an MEMS resonator manufactured thereby and a sensor.

BACKGROUND ART

Microelectromechanical Systems (MEMS) resonator is used in various fields such as filters, sensors, transducers and the like. Examples of sensors using the MEMS resonator include inertial sensors, such as a resonant MEMS gyroscope and an accelerometer. In regard to the resonant MEMS gyroscope (MEMS resonant gyroscope), if a frequency of a driving unit matches with a frequency of a measuring unit, a sensing capability greatly increases. Thus, a method for controlling a natural frequency of the MEMS resonator is required. Additionally, when a natural frequency error occurs in a device using the MEMS resonator, such natural frequency control method is used to correct the error and increase product uniformity.

A laser ablation, a Chemical Vapor Deposition (CVD), a Focused Ion Beam (FIB) and the like are usually used as the natural frequency control method for the MEMS resonator. The MEMS resonator frequency control method using the laser ablation is configured to control the frequency by removing a mass of the resonator using a laser. The CVD and the FIB control the frequency by depositing a material on the MEMS resonator to increase the mass of the resonator. However, those methods require expensive equipment and facilities, take a longer time to perform the control, and is unable to restore the controlled frequency.

Therefore, an MEMS resonator and a manufacturing method capable of overcoming those drawbacks may be considered.

TECHNICAL GIST OF THE PRESENT INVENTION

Therefore, an aspect of the present disclosure is to provide an MEMS resonator capable of easily controlling (setting) a natural frequency of the MEMS resonator, a sensor having the same and a method for controlling a natural frequency of the MEMS resonator.

Also, another aspect of the present disclosure is to provide an MEMS resonator having reversibility and a method for manufacturing the same.

To achieve these and other advantages and in accordance with the purpose of the present invention, as embodied and broadly described herein, there is provided a microelectromechanical system (MEMS) resonator including a base substrate of the MEMS resonator, the base substrate having a recess portion recessed into one surface thereof, an oscillator mounted at the base substrate and at least partially overlapping the recess portion to be vibrated (oscillated) within an empty space of the recess portion, and a wire connected to the oscillator and the base substrate, respectively, to control a natural frequency of the MEMS resonator by supporting at least part of the oscillator.

In accordance with one example, a thin film may be deposited on the one surface of the base substrate, and the oscillator may extend from the thin film.

First and second metal layers may be formed at one surfaces of the thin film and the oscillator, respectively, and the wire may allow the first and second metal layers to be connected to each other. The wire may be formed by dielectrophoresis using the first and second metal layers as electrodes. The wire may contain nanoparticles, which are stuck onto the first and second metal layers by the dielectrophoresis.

The first and second metal layers may be disposed at structures, which protrude from the thin film and the oscillator into the empty space, respectively. The first and second metal layers may be disposed to face each other.

In accordance with another example, the wire may be cut in response to a voltage being applied.

In accordance with another example, the oscillator may be implemented as a cantilever having a fixed end connected to the base substrate and a free end extending from the recess portion, or implemented as a fixed beam having both ends connected to the base substrate by crossing the recess portion.

Also, to achieve those aspects of the present disclosure, there is provided a sensor including a sensor main body, the microelectromechanical system (MEMS) resonator mounted in the main body and having an oscillator, and a controller configured to detect a displacement of the oscillator to thus measure an acceleration or an angular rate.

To achieve those aspects of the present disclosure, there is provided a method for manufacturing a microelectromechanical system (MEMS) resonator having an oscillator extending from a base substrate, the manufacturing method including manufacturing the MEMS resonator having first and second electrode layers at the base substrate and the oscillator, respectively, filling a solution between the first and second electrode layers, the solution mixed with nanoparticles, and forming a wire connecting the base substrate and the oscillator to each other by supplying power to the first and second electrode layers, thus to control the natural frequency of the MEMS resonator by supporting at least part of the oscillator.

In accordance with one example related to the manufacturing method, the manufacturing step may include depositing a thin film on the base substrate, etching the thin film to form preset patterns, depositing the first and second metal layers on the pattern-formed thin film, and forming the oscillator by etching the base substrate.

In accordance with another example related to the manufacturing method, the solution may be mixed with monomers of a polymer. The nanoparticle may contain at least one of carbon nano tube, fullerene, gold nanoparticle and silver nanoparticle.

In accordance with another example related to the manufacturing method, the method may further include cutting the wire by applying a voltage to the wire to restore the natural frequency of the MEMS resonator.

MODE FOR CARRYING OUT THE PREFERRED EMBODIMENTS

Description will now be given in detail of an MEMS resonator, a sensor having the same and a manufacturing method for the MEMS resonator (a natural frequency control method) in accordance with the exemplary embodiments, with reference to the accompanying drawings. For the sake of brief description with reference to the drawings, the same or equivalent components will be provided with the same reference numbers, and description thereof will not be repeated. The expression in the singular form in this specification will cover the expression in the plural form unless otherwise indicated obviously from the context.

Figure 1:
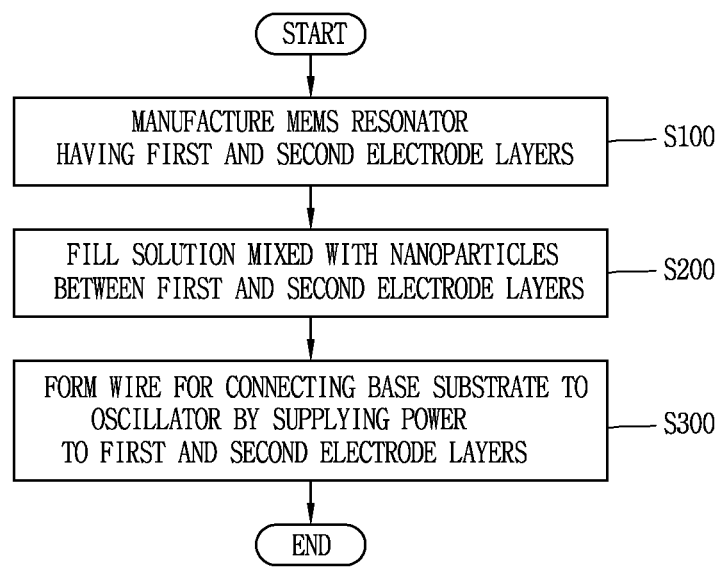
FIG. 1 is a flowchart illustrating a method for manufacturing an MEMS resonator in accordance with one exemplary embodiment.
Figure 2:
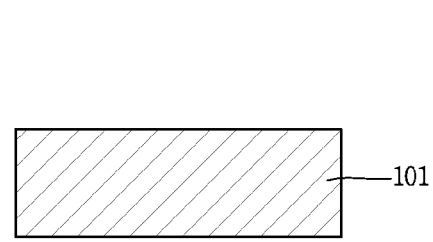
FIG. 2 is a schematic view illustrating processes of manufacturing the MEMS resonator prior to a wire formation (generation)
Figure 2:
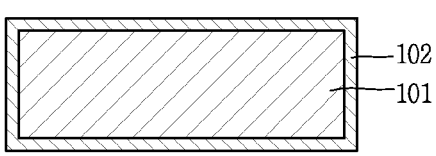
Figure 2:
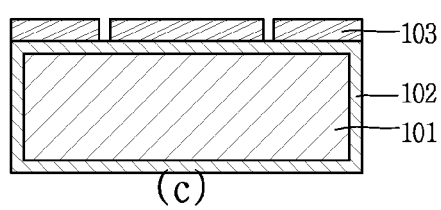
Figure 2:
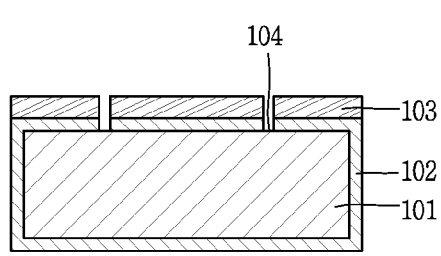
Figure 2:
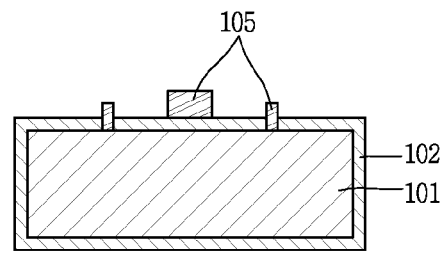
Figure 2:
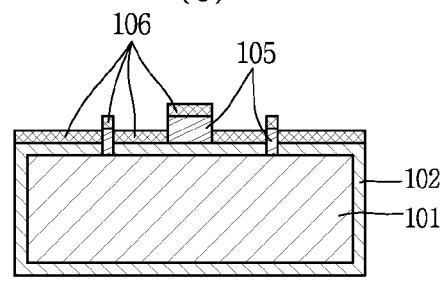
Figure 2:
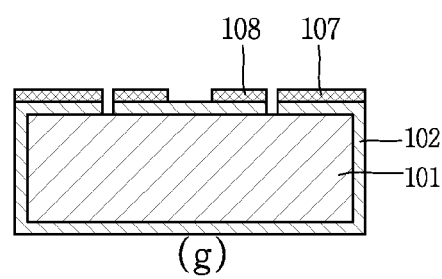
Figure 2:
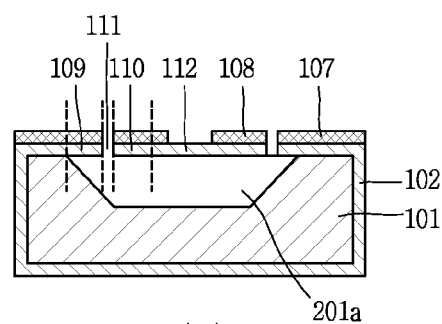
Figure 3:
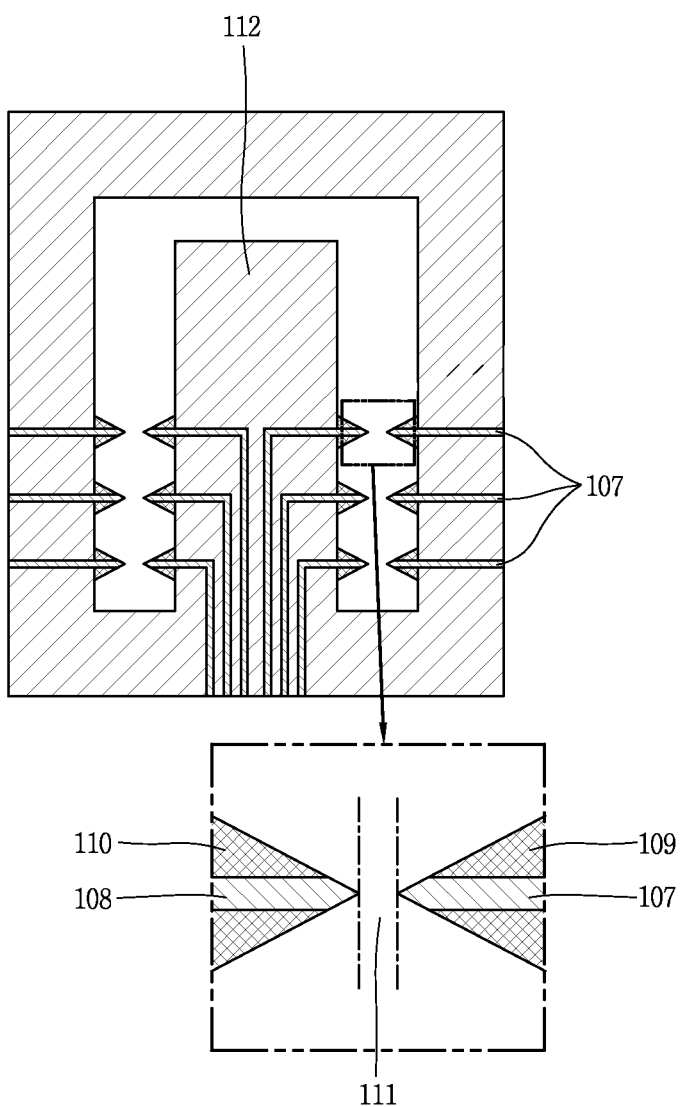
FIG. 3 is a planar view of the MEMS resonator prior to the wire formation in the manufacturing method of FIG. 1.
Figure 4:
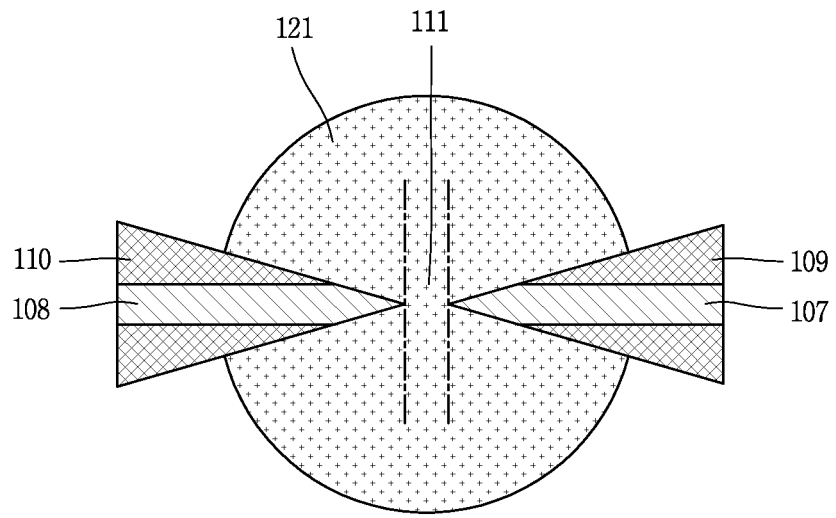
FIG. 4 is an overview of supplying a solution for the wire formation in the MEMS resonator of FIG. 3.
Figure 5:
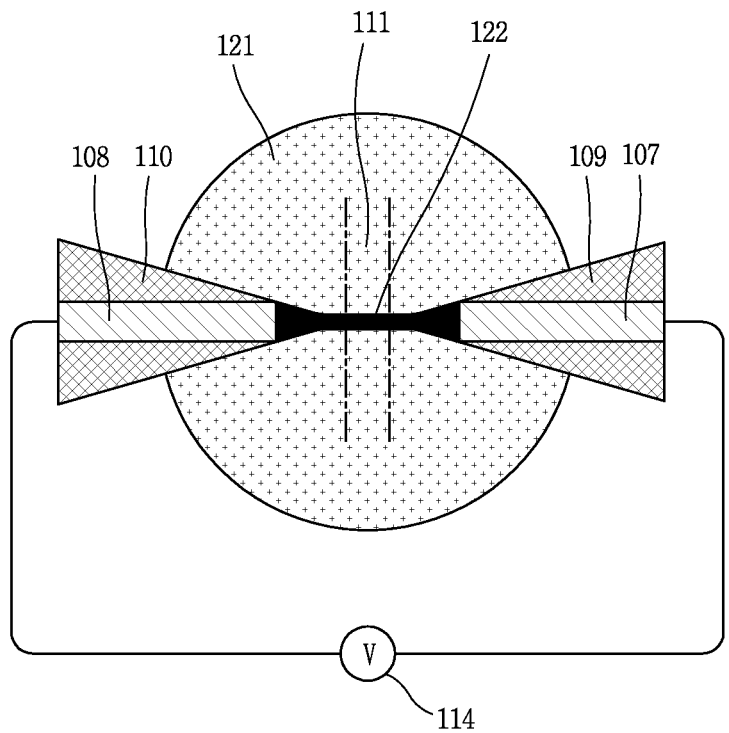
FIG. 5 is an overview of forming the wire in the MEMS resonator of FIG. 3.
Figure 6:
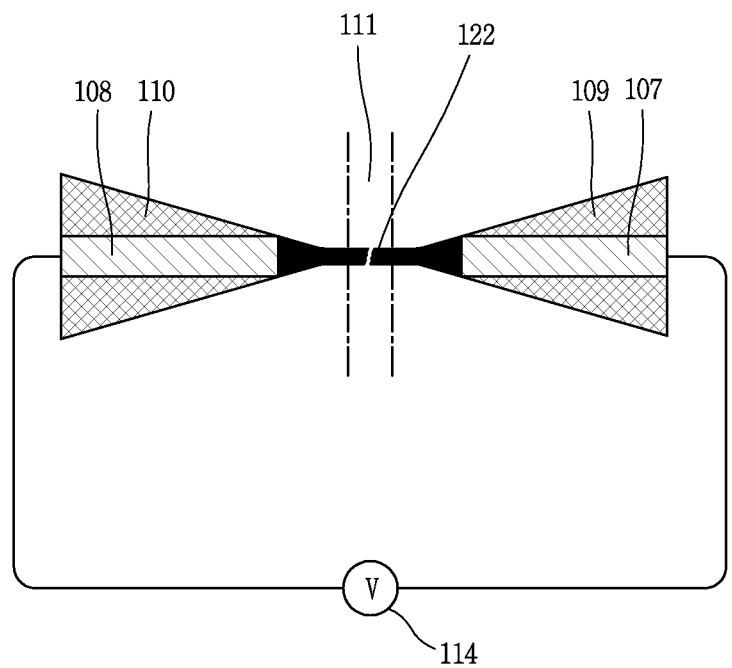
FIG. 6 is an overview illustrating a method for electrically cutting the wire formed in the MEMS resonator as illustrated in FIG. 5.

FIG. 1 is a flowchart illustrating a method for manufacturing an MEMS resonator in accordance with one exemplary embodiment, FIG. 2 is a schematic view illustrating processes of manufacturing the MEMS resonator prior to a wire formation, FIG. 3 is a planar view of the MEMS resonator prior to the wire formation in the manufacturing method of FIG. 1, FIG. 4 is an overview of supplying a solution for the wire formation in the MEMS resonator of FIG. 3, FIG. 5 is an overview of forming the wire in the MEMS resonator of FIG. 3, and FIG. 6 is an overview illustrating a method for electrically cutting the wire formed in the MEMS resonator as illustrated in FIG. 5.

Referring to FIG. 1, a method for manufacturing an MEMS resonator may include manufacturing an MEMS resonator which has first and second electrode layers formed on a base substrate and an oscillator, respectively (S100).

The MEMS resonator may include the oscillator extending from the base substrate. To implement the type of resonator, the manufacturing step S100 may include a thin film deposition, an etching, a metal layer deposition, and an oscillator formation.

At the thin film deposition step, a thin film may be deposited on the base substrate. For example, an operator prepares a substrate 101 made of silicon as illustrated in FIG. 2(a), and deposits a low stress silicon nitride thin film 102 on the substrate 101 through a Low Pressure Chemical Vapor Deposition (LPCVD) as illustrated in FIG. 2(b).

At the etching step, the thin film may be etched to form preset patterns. Especially, as illustrated in FIG. 2(c), pattern layers 103 are formed by photolithography, and the silicon nitride thin film 102 is etched out along open patterns 104 by a Reactive Ion Etching (RIE).

At the metal layer deposition step, first and second metal layers may be deposited on the pattern-formed thin film. For example, as illustrated in FIG. 2(e), the existing pattern layers 103 are removed and then new pattern layers 105 are formed by the photolithography. As illustrated in FIG. 2(f), a metal layer 106 made of chrome, gold or the like is deposited on the new pattern layers 105. Afterwards, as illustrated in FIG. 2(g), the pattern layers 105 are removed, thereby forming a first electrode film (a stationary side electrode 107) and a second electrode film (an oscillator side electrode 108).

At the oscillator formation step, the base substrate 101 may be etched to form an oscillator 112. More particularly, the base substrate 101 is entirely etched using a tetramethylammonium hydroxide (TMAH) solution. Consequently, as illustrated in FIG. 2(h) and FIG. 3, an MEMS resonator is completely manufactured.

The thusly-manufactured MEMS resonator, as illustrated in FIG. 3, is an MEMS resonator having a cantilever type oscillator 112. The MEMS resonator may include structures 109 and 110, which are symmetric to each other and formed for a wire formation. A space 111 for forming the wire may be defined between the two structures 109 and 110. The structures 109 and 110 may protrude into the space 111. Especially, the structures 109 and 110 may protrude from the base substrate 101 and the oscillator 112, respectively, to face each other.

The silicon substrate 101, the low stress silicon nitride thin film 102 and the metal layer 106 made of chrome, gold or the like, which have described in the one example of the manufacturing of the MEMS resonator (S100), may be formed of different materials from one another. The present disclosure may not be limited to the LPCVD, the RIE and the photolithography, which are used as process schemes, and the MEMS resonator may be manufactured by other manufacturing method.

Referring back to FIG. 1, the method for manufacturing the MEMS resonator may include filling a solution, in which nanoparticles are mixed, between the first and second electrode films (S200).

The solution may be prepared by mixing a solvent and nanoparticles. For example, 0.01 to 10% by weight of carbon nano tube (CNT) may be added to the solvent, and additionally the solution may be processed by a surfactant and supersonic waves.

Referring to FIG. 4, a solution 121 prepared for the wire formation may be supplied in the space 111, which is defined for the wire formation between the structure 110 for wire formation at the side of the oscillator 112 and the structure 109, facing the structure 110, for a thin film side wire formation.

The nanoparticle may include at least one of fullerene (C60), gold nanoparticle and silver nanoparticle, as well as the carbon nano tube (CNT). Also, the solution may be mixed with monomers of a functional polymer, such as pinole, aniline and the like, as well as the nanoparticles.

Next, in order to control a natural frequency of the MEMS resonator by supporting at least part of the oscillator 112, power may be supplied to the first and second electrode layers 107 and 108 so as to form a wire for connecting the base substrate 101 and the oscillator 112 to each other (S300).

For example, as illustrated in FIG. 5, voltages may be applied to the first and second electrode layers 107 and 108 using a function generator 114. The voltages may be alternating current (AC) voltages in the frequency range of 1 kHz to 100 MHz. The applied voltages allow the nanoparticles within the solution 121 for the wire formation to be aggregated at the structures 109 and 110 for the wire formation by dielectrophoresis. The aggregated nanoparticles may be stuck together, thereby forming a wire 122.

A natural frequency f of the MEMS resonator may be decided by a modulus of elasticity k and an effective mass m of the resonator as expressed by Equation (1).

$$f = \frac{1}{2\pi}\sqrt{\frac{k}{m}} \quad (1)$$

Referring to FIG. 5, the formed wire may increase a natural frequency f' of the MEMS resonator by increasing a modulus of elasticity k+k' of the oscillator 112 or decreasing an effective mass m−m' thereof. This can be expressed by the following Equation (2).

$$f' = \frac{1}{2\pi}\sqrt{\frac{k+k'}{m-m'}} \quad (2)$$

The modulus of elasticity may depend on the property of the wire, and the effective mass may depend on the arrangement of the electrode structures of the MEMS resonator.

Also, the manufacturing method may include cutting the wire by applying voltages to the wire so as to restore the natural frequency of the MEMS resonator. That is, as illustrated in FIG. 6, when the wire 122 formed in the MEMS resonator is cut using an electrical method, the affection by the wire may be disappeared, so the natural frequency of the MEMS resonator may be restored to its original state.

For example, when strong voltages are applied to the first and second electrode layers 107 and 108 for the wire formation using the function generator 114, a strong current flows along the wire 122 and accordingly the wire 122 is electrically cut.

As such, the frequency control method for the MEMS resonator using the wire formation, proposed in this specification, has advantages in that the control of the natural frequency of the MEMS resonator can be allowed by forming a wire using basic equipment and the natural frequency of the MEMS resonator can be restored by simply cutting the wire.

Figure 7:
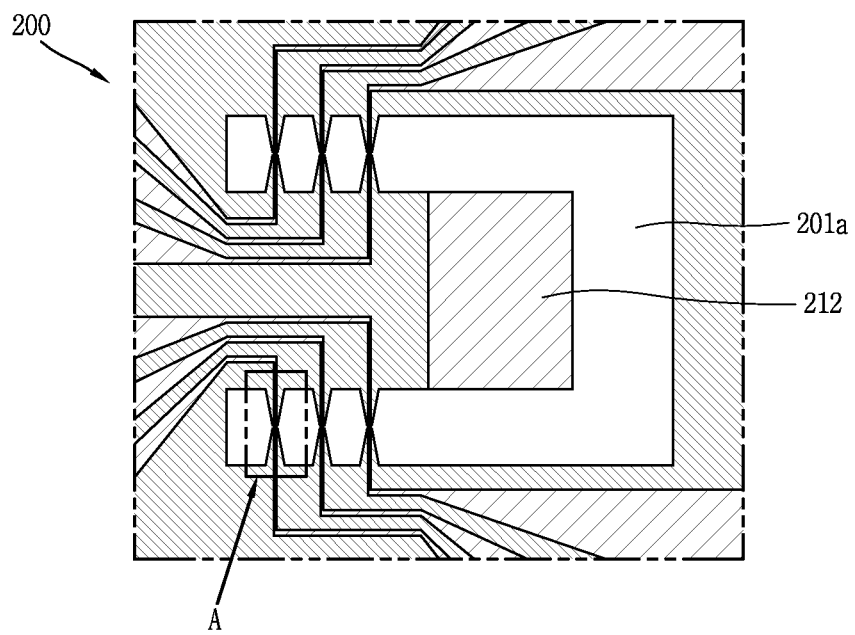
FIG. 7 is an overview corresponding to a microscopic image of an MEMS resonator manufactured by the manufacturing method.
Figure 8:
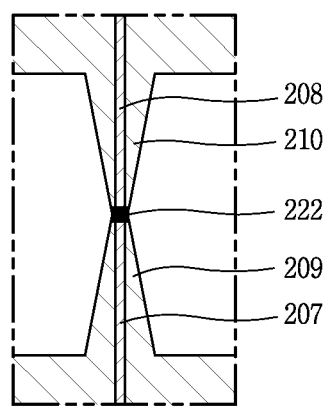
FIG. 8 is an enlarged view of part A of FIG. 7.
Figure 9:
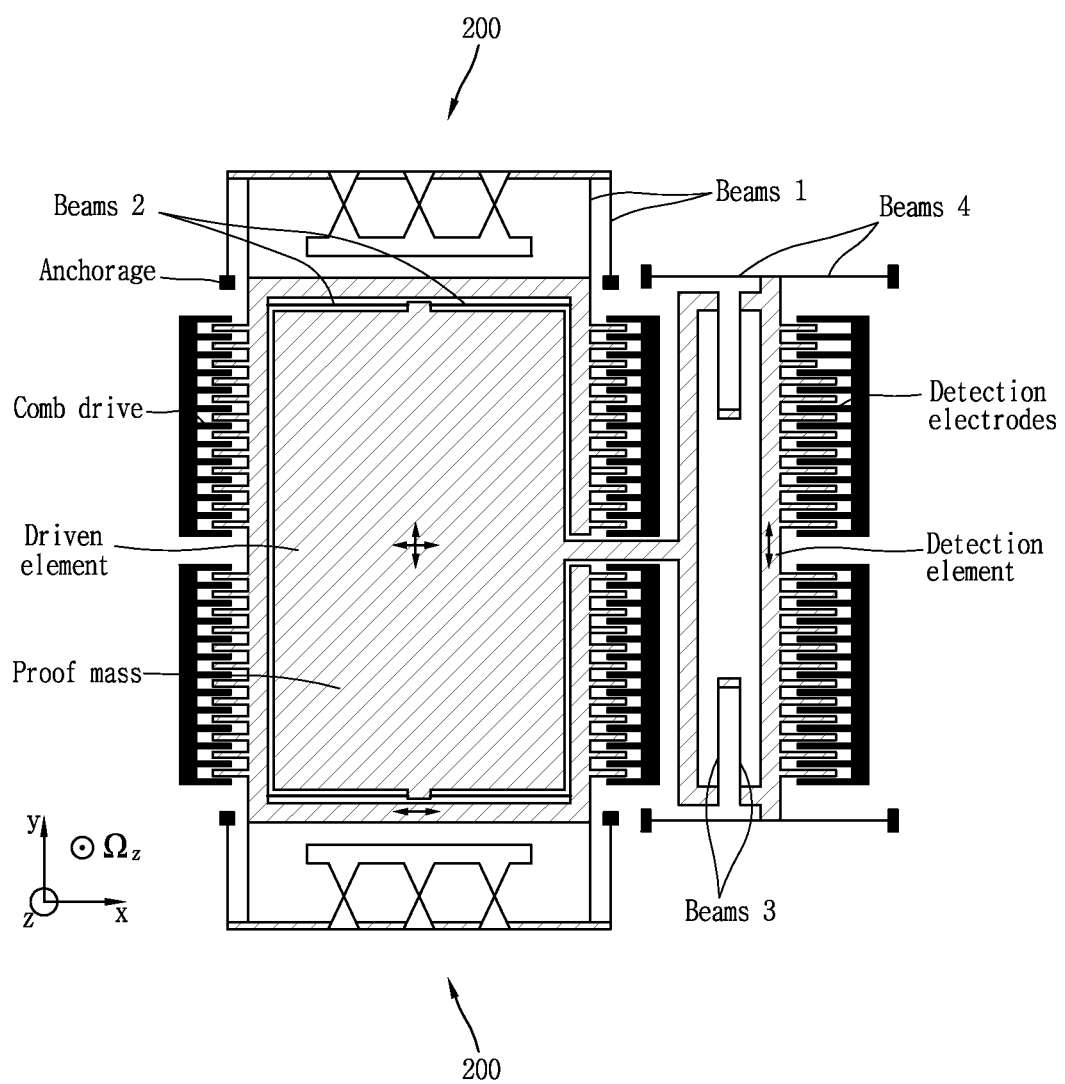
FIG. 9 is an overview of a sensor having the MEMS resonator of FIG. 7.

Hereinafter, description will be made in detail to a structure of the MEMS resonator manufactured according to the manufacturing method, and a sensor using the same, with reference to FIGS. 3, 7 and 8. FIG. 7 is an overview corresponding to a microscopic image of an MEMS resonator manufactured by the manufacturing method, FIG. 8 is an enlarged view of part A of FIG. 7, and FIG. 9 is an overview of a sensor having the MEMS resonator of FIG. 7.

As illustrated in the drawings, an MEMS resonator 200 may include a base substrate 201, an oscillator 212 and a wire 222.

The base substrate 201 may include a recess portion 201a recessed into one surface thereof. The oscillator 212 may be mounted in the base substrate 201 and partially overlap the recess portion 201a to be oscillated within an empty space of the recess portion 201a. The recess portion 201a, as illustrated in FIG. 3, may define a space for allowing transformation of the oscillator 212.

The oscillator 212 may be a cantilever type having a fixed end connected to the substrate 201 and a free end extending to the recess portion 201a. Here, the present disclosure may not be limited to the structure. The oscillator may be implemented as a fixed beam having both ends connected to the substrate by crossing the recess portion.

Referring to FIGS. 7 and 8, a thin film 202 may be deposited on the base substrate 201 to cover one surface of the base substrate 201. The oscillator 212 may extend from the thin film 202.

First and second metal layers 207 and 208 may be formed on one surfaces of the thin film 202 and the oscillator 212, respectively. The first and second metal layers 207 and 208 may be defined by structures 209 and 210, which protrude from a substrate side thin film and an oscillator side thin film, respectively, toward the empty space of the recess portion 201a. The first and second metal layers 207 and 208 may face each other. Also, the structures 209 and 210 may be provided in a plurality of pairs, each pair being spaced apart by a preset distance.

The wire 222 may be connected to the oscillator 212 and the base substrate 201, respectively, to support at least part of the oscillator 212 so as to control a natural frequency of the MEMS resonator 200. More particularly, the wire 222 may allow connection between the first and second metal layers 207 and 208. The wire 222 may be formed by dielectrophoresis using the first and second metal layers 207 and 208 as electrodes. The wire 222 may contains nanoparticles which are stuck onto the first and second metal layers 207 and 208 by the dielectrophoresis. The wire 222 may be cut in response to voltages being applied. Accordingly, a reversible MEMS resonator 200 may be implemented.

Hereinafter, description will be given of a sensor having the MEMS resonator.

A sensor may include a sensor main body, the MEMS resonator 200 illustrated in FIGS. 7 and 8, and a controller. The MEMS resonator 200 may be mounted on the sensor main body, and detect a displacement of the oscillator such that the controller can measure an acceleration and an angular rate.

As one example of the sensor, the MEMS resonator of FIGS. 7 and 8 may be applied to a resonant gyroscope illustrated in FIG. 9. The resonant gyroscope of FIG. 9 is implemented by applying the MEMS resonator of the present disclosure to a structure of a well-known gyroscope.

As illustrated in FIG. 9, in the resonant gyroscope, a gyro may be vibrated (oscillated) using a proof mass of a gyro as a driving shaft. Here, a displacement of a sensing axis changed by Coriolis force, which is generated in a perpendicular direction by an angular rate coming from the exterior, is measured so as to sense an angular rate. The resonant gyroscope may have a measuring axis and a sensing axis perpendicularly crossing each other. Each axis may be represented as a mass, a spring and a damping system and has a resonant frequency. Also, the resonant gyroscope exhibits the maximum displacement at a resonant point, and also a displacement 1000 to 100000 times higher than that upon statically applying the same force to a high Q-factor. The measuring axis may vibrate the resonant frequency to reduce energy consumption and maximize the displacement. Here, when the resonant frequency of the measurement axis matches with the resonant frequency of the driving shaft, the displacement of the measurement axis is maximized to remarkably improve sensitivity of the gyro. Hence, the resonant gyroscope, to which the MEMS resonator 200 of FIG. 7 allowed to easily control the natural frequency is applied, can facilitate increasing of a sensing capability.

Also, the MEMS resonator of FIG. 7 may be applied to a cantilever sensor. The cantilever sensor may be run by a principle of measuring the change in a mass by a material coupled to a surface of a cantilever and the change in a resonant frequency in response to the mass change. Therefore, upon applying the MEMS resonator of FIG. 7, the control of the resonant frequency may be enabled within an area sensitive to a frequency tuning.

Figure 10:
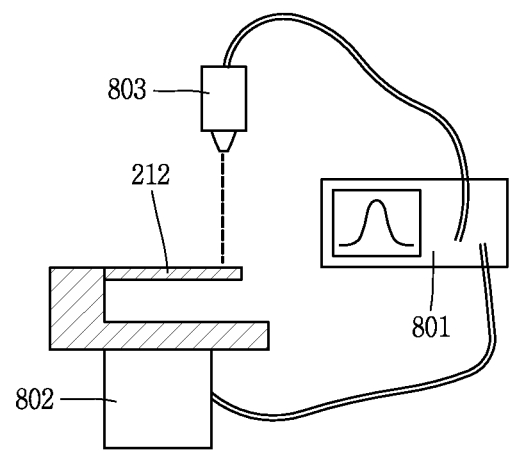
FIG. 10 is an overview illustrating a method for measuring a natural frequency of the MEMS resonator.
Figure 11:
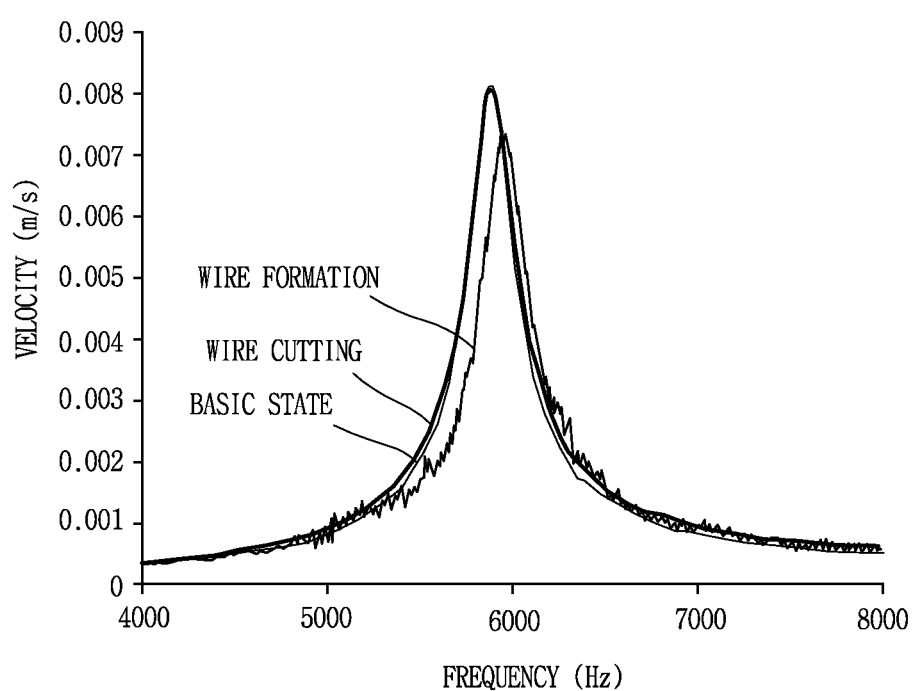
FIG. 11 is a graph illustrating results of the natural frequency of the MEMS resonator being controlled.

FIG. 10 is an overview illustrating a method for measuring a natural frequency of the MEMS resonator, and FIG. 11 is a graph illustrating results of the natural frequency of the MEMS resonator being controlled.

As illustrated in FIG. 10, an output voltage of a Fast Fourier Transform (FFT) analyzer 801 is connected to a piezoelectric element (PZT) 802. Accordingly, a vibration is applied to the oscillator 212 of the MEMS resonator. In more detail, a frequency is changed in a state that the output voltage is constant. The PZT 802 changes the frequency to apply a vibration to the oscillator 212 of the MEMS resonator. The vibration of the oscillator 212 is measured by a laser vibrometer 803 so as to be inputted as a voltage signal in the FFT analyzer 801. The FFT analyzer 801 records the vibration of the oscillator 212 according to a frequency.

As illustrated in FIG. 11, a natural frequency of the MEMS resonator, which is measured in a basic state prior to a wire formation, is 5.89 kHz. When the wire is formed, it increases to 5.96 kHz. Also, referring to the graph, when the wire is cut, the natural frequency of the MEMS resonator is restored to 5.89 kHz.

As such, as the wire containing nanoparticles is formed, a mechanical properties of the resonator can be controlled, which allows control of the natural frequency. In addition, the arrangement of the electrodes, which the wire is to be formed therebetween, and the property change of the wire may facilitate the control of the natural frequency with a low cost.

In accordance with the MEMS resonator, the sensor having the same and the manufacturing method for the MEMS resonator, a wire can be electrically formed to allow fast control (setting) of a natural frequency of the MEMS resonator with a low cost by virtue of the use of basic equipment. By employing such resonator, functions of resonant sensors, such as a resonant MEMS gyroscope, an accelerometer and the like, can be improved.

Also, the formed wire can be simply electrically cut, which allows restoring of a natural frequency of the MEMS resonator.

In addition, the method for controlling the natural frequency of the MEMS resonator through the wire formation can be easily applied with a low cost, thereby being applicable to a broader range of MEMS resonators.

The MEMS resonator, the sensor having the same and the method for manufacturing the MEMS resonator may not be limited to the foregoing configurations and method. Part or all of the embodiments may be selectively combined such that various modifications and variations can be made without departing from the spirit or scope of the invention. Thus, it is intended that the present invention cover modifications and variations of this invention provided they come within the scope of the appended claims and their equivalents.

The invention claimed is:

1. A microelectromechanical system (MEMS) resonator comprising:
   a base substrate of the MEMS resonator, the base substrate having a recess portion concaved from one surface thereof;
   an oscillator mounted at the base substrate and at least partially overlapping the recess portion to be vibrated within an empty space of the recess portion;
   a wire connected to the oscillator and the base substrate, respectively, to control a natural frequency of the MEMS resonator by supporting at least part of the oscillator; and
   a thin film deposited on the surface of the base substrate, wherein the oscillator extends from the thin film and is positioned in the same plane of the thin film.

2. The resonator of claim 1, wherein a first metal layer is formed on a surface of the thin film and a second metal layer is formed on a surface of the oscillator, wherein the wire allows the first and second metal layers to be connected to each other.

3. The resonator of claim 2, wherein the wire is formed by dielectrophoresis using the first and second metal layers as electrodes.

4. The resonator of claim 3, wherein the wire contains nanoparticles, the nanoparticles being stuck onto the first and second metal layers by the dielectrophoresis.

5. The resonator of claim 2, wherein the first and second metal layers are disposed at structures, the structures protruding from the thin film and the oscillator, respectively, into the empty space.

6. The resonator of claim 2, wherein the first and second metal layers are disposed to face each other.

7. The resonator of claim 2, wherein the wire is cut when a voltage is applied to the first metal layer and the second metal layer, respectively.

8. The resonator of claim 1, wherein the oscillator is implemented as a cantilever having a fixed end connected to the base substrate and a free end extending from the recess portion, or implemented as a fixed beam having both ends connected to the base substrate by crossing the recess portion.

9. A sensor comprising:
   a sensor main body;
   a microelectromechanical system (MEMS) resonator mounted in the main body, having an oscillator, and configured according to claim 1; and
   a controller configured to detect a displacement of the oscillator to thus measure an acceleration or an angular rate.

* * * * *